US010917037B2

(12) United States Patent
Remy et al.

(10) Patent No.: US 10,917,037 B2
(45) Date of Patent: Feb. 9, 2021

(54) SOLAR TRACKER ASSEMBLY

(71) Applicant: Saint-Augustin Canada Electric Inc., Saint-Augustin de Desmaures (CA)

(72) Inventors: Thierry Remy, Vif (FR); Patrick Herembert, Crolles (FR)

(73) Assignee: Saint-Augustin Canada Electric Inc., Quebec (CA)

( * ) Notice: Subject to any disclaimer, the term of this patent is extended or adjusted under 35 U.S.C. 154(b) by 236 days.

(21) Appl. No.: 14/772,975

(22) PCT Filed: Mar. 5, 2014

(86) PCT No.: PCT/EP2014/000555
§ 371 (c)(1),
(2) Date: Sep. 4, 2015

(87) PCT Pub. No.: WO2014/135273
PCT Pub. Date: Sep. 12, 2014

(65) Prior Publication Data
US 2016/0020724 A1 Jan. 21, 2016

(30) Foreign Application Priority Data
Mar. 5, 2013 (FR) ...................................... 13 51965

(51) Int. Cl.
*H02S 20/32* (2014.01)
*F24S 25/12* (2018.01)
(Continued)

(52) U.S. Cl.
CPC .............. *H02S 20/32* (2014.12); *F24S 25/12* (2018.05); *F24S 30/452* (2018.05);
(Continued)

(58) Field of Classification Search
CPC .... F24J 2/5232; F24J 2/54; F24J 2/525; F24J 2/542; H02S 20/32; H02S 30/10;
(Continued)

(56) References Cited

U.S. PATENT DOCUMENTS

2001/0036024 A1    11/2001  Wood
2008/0236567 A1*   10/2008  Hayden .................. H02S 20/30
                                                          126/569

(Continued)

FOREIGN PATENT DOCUMENTS

CN    102788443 A    11/2012
CN    102819268 A    12/2012
(Continued)

OTHER PUBLICATIONS

French Search Report for French Application No. 1351965 dated Nov. 7, 2013, 6 pages.
(Continued)

*Primary Examiner* — Michael Y Sun
(74) *Attorney, Agent, or Firm* — TraskBritt

(57) ABSTRACT

The disclosure relates to a solar tracker assembly, particularly for solar collectors, with a table structure for supporting the solar collectors, particularly solar collector panels and/or solar collector assemblies, and with an assembly for carrying the table structure, wherein the table structure is rotatable relative to the assembly base at least about one axis of rotation. For allowing the table for supporting respective solar panels to have sufficiently large dimensions in order to accommodate an increased number of solar collectors in an easy way and, at the same time, to enable the table to be positioned at a precise angle with reduced effort, it is suggested that at least a portion of the table structure and/or a portion of the assembly base is formed as a truss structure.

14 Claims, 11 Drawing Sheets

(51) Int. Cl.
*F24S 30/452* (2018.01)
*H02S 30/10* (2014.01)
*H01L 31/042* (2014.01)
*F24S 30/20* (2018.01)
*F24S 30/40* (2018.01)
*F24S 30/455* (2018.01)
*F24S 30/45* (2018.01)
*F24S 30/428* (2018.01)
*F24S 30/48* (2018.01)
*F24S 30/458* (2018.01)
*F24S 30/422* (2018.01)
*F24S 30/425* (2018.01)
*F24S 30/00* (2018.01)

(52) U.S. Cl.
CPC ............ H01L 31/042 (2013.01); H02S 30/10 (2014.12); *F24S 30/20* (2018.05); *F24S 30/40* (2018.05); *F24S 30/422* (2018.05); *F24S 30/425* (2018.05); *F24S 30/428* (2018.05); *F24S 30/45* (2018.05); *F24S 30/455* (2018.05); *F24S 30/458* (2018.05); *F24S 30/48* (2018.05); *F24S 2030/10* (2018.05); *F24S 2030/11* (2018.05); *F24S 2030/12* (2018.05); *F24S 2030/16* (2018.05); *F24S 2030/17* (2018.05); *Y02E 10/47* (2013.01)

(58) Field of Classification Search
CPC ....... Y02E 10/47; Y02E 10/50; H01L 31/042; F24S 25/12; F24S 30/452; F24S 2030/10; F24S 2030/17; F24S 2030/16; F24S 2030/12; F24S 2030/11; F24S 30/40; F24S 30/455; F24S 30/45; F24S 30/428; F24S 30/48; F24S 30/458; F24S 30/422; F24S 30/425; F24S 30/20
See application file for complete search history.

(56) References Cited

U.S. PATENT DOCUMENTS

2011/0240093 A1* 10/2011 Tucker .................. H01L 31/045
  136/245
2014/0216440 A1* 8/2014 Michotte De Welle .....................
  F24J 2/5209
  126/600

FOREIGN PATENT DOCUMENTS

| CN | 102865687 A | 1/2013 | |
|---|---|---|---|
| CN | 202748522 U | 2/2013 | |
| CN | 102679601 | 7/2013 | |
| EP | 2292877 A1 | 3/2011 | |
| WO | 8803635 A1 | 5/1988 | |
| WO | 2011163563 A1 | 12/2011 | |
| WO | 2012164217 A1 | 12/2012 | |
| WO | WO 2012164217 A1 * | 12/2012 | ............. F24J 2/5209 |

OTHER PUBLICATIONS

International Search Report for International Application No. PCT/2014/000555 dated Jun. 16, 2014, 4 pages.
International Preliminary Report on Patentability for Internation Application No. PCT/2014/000555 dated Sep. 8, 2015, 4 pages.
International Written Opinion for Internation Application No. PCT/2014/000555 dated Sep. 8, 2015, 3 pages.
Chinese First Search for Chinese Application No. 2014800192283, dated Feb. 7, 2017, 1 page.
Chinese Office Action for Chinese Application No. 201480019228.3 dated Feb. 23, 2017, 13 pages.
Second Chinese Office Action for Chinese Application No. 201480019228.3 dated Sep. 8, 2017, 15 pages.
Chinese Notification of Reexamination for Chinese Application No. 201480019228.3 dated Feb. 11, 2019, 6 pages.

* cited by examiner

SOLAR TRACKER ASSEMBLY

CROSS-REFERENCE TO RELATED APPLICATIONS

This application is a national phase entry under 35 U.S.C. § 371 of International Patent Application PCT/EP2014/000555, filed Mar. 5, 2014, designating the United States of America and published in English as International Patent Publication WO 2014/135273 A1 on Sep. 12, 2014, which claims the benefit under Article 8 of the Patent Cooperation Treaty and under 35 U.S.C. § 119(e) to French Patent Application Serial No. 1351965, filed Mar. 5, 2013, the disclosure of each of which is hereby incorporated herein in its entirety by this reference.

TECHNICAL FIELD

The disclosure is directed to a solar tracker assembly, particularly to a solar tracker assembly for solar collectors.

BACKGROUND

A solar tracker assembly for solar collectors is known from the prior art document WO 2011/163563 A1. This solar tracker assembly comprises a vertical mast, which is arranged in a solid ground. Further to this, the known solar tracker assembly is equipped with a table for supporting solar modules, wherein the table is rotatably mounted on the top of the mast. The table for supporting the solar collectors and the mast for carrying the table are connected to each other at one coupling point. The table may be rotated about a vertical as well as a horizontal axis.

This construction of a solar assembly, however, limits the size of the table. In particular, the weight of the table causes it to bend around the coupling point, negatively affecting the positioning accuracy of the solar modules mounted on the table. In addition to this, deflections of the table may be increased by high wind speeds, rain or snow, to which the solar tracker may be exposed.

Due to this limited size of the table of the solar tracker known from WO 2011/163563 A1, only a limited number of solar modules may be supported by a single solar tracker assembly. Specifically, in the case of solar parks, this requires an increased number of solar tracker assemblies, which, in turn, leads to high costs for the entire solar park.

Furthermore, it is known from the prior art to provide a solar tracker assembly with an intermediate structure between a vertical mast and a table for supporting solar panels. Such an intermediate structure may have a V-shape, such that it is coupled to the top of the vertical mast at one coupling point and coupled to the table at two separate points, which are arranged at a distance from each other. A drive unit for the rotation about a vertical axis may be arranged at the coupling point between the intermediate structure and the top of the vertical mast and two separate drive units for rotating the table about a horizontal axis may be provided at the coupling points between the table and the intermediate structure.

This construction improves the support for the table, allowing the table to have greater dimensions and, accordingly, carry a greater number of solar panels. However, by increasing the dimensions of the table and by providing an intermediate structure in addition, the weight of the solar tracker assembly significantly increases. This impedes the table of the solar tracker to be precisely adjusted. A precise adjustment of the angle of the table is essential for effectively collecting solar energy, as the amount of collected solar energy is optimal when the respective solar panels are precisely arranged orthogonal relative to the incoming sunlight. This applies, in particular, in the case of solar systems, which are equipped with Fresnel lenses, i.e., Concentrated PhotoVoltaic (CPV).

BRIEF SUMMARY

In order to achieve a high degree of precision in adjusting the angle of the table in the case of a heavy solar tracker assembly construction, the use of expensive drives for positioning the table is required, whereby the total costs of a single solar tracker assembly are, in turn, increased.

Against this background, it has been the objective of the disclosure to provide a solar tracker assembly, particularly for solar collectors, that allows the table for supporting respective solar panels to have sufficiently large dimensions in order to accommodate an increased number of solar collectors in an easy way and, at the same time, to enable the table to be positioned at a precise angle with reduced effort.

This objective has been solved by a solar tracker assembly according to claim 1. The subject matters of the dependent claims refer to advantageous embodiments of the disclosure and will be described in the following detailed description.

According to the disclosure, a solar tracker assembly comprises a table structure for supporting solar collectors, particularly solar collector panels and/or solar collector assemblies. Further, the solar tracker assembly according to the disclosure comprises an assembly base for carrying the table structure, wherein the table structure is rotatable relative to the assembly base at least about one axis of rotation. A rotation of the table structure relative to the assembly base enables solar collectors, which are arrangeable on the table, to be adjusted in their position relative to the incoming sunlight, such that the amount of solar energy collected by the solar collectors may be maximized.

According to the disclosure, it is now provided that at least a portion of the table structure and/or a portion of the assembly base is formed as a truss structure.

A truss structure may comprise a plurality of straight members, which are connected to each other, for example, in a triangle shape, in order to provide a construction that has high bearing capabilities, while at the same time having a limited weight. Possibly, the straight members of the truss structure are connected to each other at their end portions. The connection of the straight members to each other may be realized by joint members, such as bolts and screws. Likewise, the straight members may be welded to each other at the respective connection portions.

Accordingly, by forming at least a portion of the table structure and/or a portion of the assembly base as a truss structure, it is possible to arrange a table structure with sufficiently great dimensions on the respective assembly base, without negatively affecting the total weight of the solar tracker assembly. At the same time, the portion formed as a truss structure provides sufficient bearing capabilities, such that mechanical deflections of the table structure and/or of the assembly base may be prevented, even for a solar collector of very large dimensions. In other terms, it has been proven after intensive research, that the solar tracker assembly according to the disclosure was able to reach the required above-mentioned specification for a wide range of solar collector configurations, for instance, in a 14 m*11 m (46 ft×36 ft) configuration or in a 7 m*22 m (23 ft×72 ft) configuration.

The dimension and notably the height of a solar tracker can be modified to fulfil local construction regulations. The height of the tracker in this case includes the length of the solar collector when the solar collector is in a vertical position, i.e., if it is rotated about axis 23 so that the solar collector is orientated approximately vertically. A modification of the dimensions of a solar collector enables easy adaptation of a tracker solution to different dimensions of the solar collector.

By significantly decreasing the weight of the solar tracker assembly, it is possible to equip the solar tracker assembly with less expensive drive units, while maintaining the positioning accuracy, which may be achieved with these drive units. Thereby, the total costs for one solar tracker assembly may be reduced, and since an inventive solar tracker assembly may also comprise a table structure with increased dimensions, a comparatively high number of solar collectors or solar collector assemblies may be positioned thereon. Thus, in case of a solar park, the required number of solar tracker assemblies may be reduced, which, in turn, leads to further reduction in constructional effort.

According to an advantageous embodiment of this disclosure, the at least one truss structure is composed of a plurality of truss structure modules, which are coupled to each other to form the respective truss structure. Thereby, the constructional effort during assembly of the solar tracker assembly may be reduced, as the respective truss structure modules may be connected to each other on site. Particularly, handling and transportation of single truss structure modules may thereby be facilitated.

According to a further embodiment of the disclosure, two adjacent truss structure modules are connected to each other via joint members. Bolts or screws may, for example, be used as joint members. The connection via joint members on the one hand avoids momentum occurring in the respective coupling point and only tensile and compressive forces are transmitted via the joint member. Likewise, two adjacent truss structure modules may be connected to each other by welding, which may be conducted with low time and handling effort.

According to a further advantageous embodiment of the disclosure, the table structure comprises at least one cross beam structure on which solar collectors are directly arrangeable. The cross beam structure may extend under an angle to the longitudinal orientation of the table structure, possibly at a right angle to the longitudinal orientation of the table structure.

Configuring the cross beam structure such that solar collectors are directly arrangeable thereon, contributes to an improved support for the respective solar panels. In particular, the cross beam structure has a short length in comparison with the longitudinal dimension of the table structure. Thus, deflections of the cross beam structure are less likely to occur due to its short length. Thereby, it is ensured that solar panels arranged on the cross beam structure are well maintained in their position along the length direction of the cross beam structure.

The support for the respective solar panels to be arranged on the solar tracker assembly may further be improved by providing a plurality of cross beam structures.

In a further embodiment of the disclosure, the table structure comprises at least one cross beam structure, which comprises a main beam structure and a main beam support structure, wherein the main beam support structure is coupled to the main beam structure for supporting it. The rigidity of the cross beam structure may thereby be improved. This specifically applies in the case where the main beam structure and/or the main beam support structure are formed as truss structures.

The table structure may be coupled to the assembly base via the main beam support structure, possibly via the main beam support structures of two cross beam structures. This allows for an optimal force transmission between the solar collectors to be supported by the table structure and the assembly base of the solar tracker assembly. In particular, by coupling the main beam support structure of at least one cross beam structure to the assembly base, the risk of deflection of the main beam structure is further decreased, which contributes to an improved positioning accuracy of the respective solar collectors.

According to a further embodiment of the disclosure, the table structure comprises at least one longitudinal beam structure, which extends along a central axis of the table structure. Thereby, a high degree of rigidity along a longitudinal orientation of the table structure is ensured, while at the same time bearing loads from the respective solar collectors may be symmetrically transmitted from the table structure to the assembly base.

According to a further embodiment of the disclosure, the table structure comprises at least one longitudinal beam structure, which couples a cross beam structure to at least another cross beam structure, wherein the longitudinal beam structure is coupled to the cross beam structures via its longitudinal end portions. This ensures a specifically stable connection between the respective cross beam structures, as the entire cross section of the longitudinal beam structure is available for the connection between the cross beam structures and the longitudinal beam structure. Thereby a particularly stable construction of the complete table structure may be achieved.

Possibly, the longitudinal beam structure is coupled to the main beam support structures of the respective cross beam structures. This allows an effective force transmission between the two coupled cross beam structures. At the same time, the respective main beam structures may primarily be designed for directly accommodating the solar panels, whereas the principal force transmission is conducted via the main beam support structures and the longitudinal beam structure.

In the case where the table structure is equipped with a plurality of cross beam structures, in particular, more than two cross beam structures, the table structure may comprise a longitudinal beam structure, which comprises a plurality of longitudinal beam portions.

Possibly, each longitudinal beam portion couples at least the cross beam structure to at least another cross beam structure. Even in the case where the respective table structure is equipped with a plurality, in particular, more than two cross beam structures, their stable connection to each other may hereby be ensured.

In order to achieve an effective coupling between the longitudinal beam portions and the respective cross beam structures, each longitudinal beam portion may be coupled to the respective cross beam structures via its longitudinal end portions.

Possibly, each longitudinal beam portion is coupled to the main beam support structures of the respective cross beam structures, whereby an effective force transmission from the main beam structure via the main beam support structure to the respective longitudinal beam portion is provided.

The longitudinal beam portions may, along their longitudinal orientation, be arranged concentric to each other, such that an optimal force transmission from a longitudinal beam portion via an adjacent main beam support structure to the subsequent longitudinal beam portion is provided.

According to a further embodiment of the disclosure, the table structure comprises at least one longitudinal beam structure, which extends along a plane, which is arranged at a distance to a plane, along which solar panels extend in their installed state. It is thereby possible to design the longitudinal beam portion for purposes of force transmission only, whereas the direct accommodation of the respective solar panels may be provided by further components of the table structure, such as the main beam structures of the cross beam structures, for example.

According to a further embodiment of the solar tracker assembly, at least two cross beam structures are, at their end portions, coupled to each other by a longitudinal coupling beam. The stability of the connection between two cross beam structures may thereby be further improved, which leads to a further improved overall stability of the complete table structure.

In one embodiment, two longitudinal coupling beams are provided, wherein all cross beam structures are, at their end portions, coupled to each other by the longitudinal coupling beams, and wherein the two longitudinal coupling beams are arranged at opposing sides of the table structure.

In a further embodiment of the solar tracker assembly, the table structure is rotatably mounted to the assembly base via at least one swivel joint and wherein the at least one swivel joint is formed by a drive unit, which is adapted to rotate the table structure relative to the assembly based about an axis of rotation. The table structure may, according to this embodiment, be positioned relative to the assembly base in a particularly high positioning accuracy. In particular, the drive unit forming the swivel joint may be a servo motor, with which a particularly high positioning accuracy may be achieved.

According to a further embodiment, the table structure is rotatably mounted to the assembly base via at least two swivel joints, which define a common axis of rotation, wherein the swivel joints are arranged at a distance from each other in a longitudinal orientation of the support structure, which distance corresponds at least to one-third, preferably at least one-half, more preferably at least two-thirds, and even more preferably at least three-fourths, of the longitudinal length of the support structure. By providing two swivel joints between the table structure and the assembly base, which are positioned relative to each other at a distance, the support for the table structure is improved, which allows the table structure to have greater dimensions without increasing the risk of deflections due to the weight of the table structure or exposures to wind, rain or snow.

In a further embodiment of the solar tracker assembly, the assembly base comprises a base structure that is adapted to be arranged in or on a solid ground, and an intermediate structure that is arranged between the base structure and the table structure for supporting the table structure relative to the base structure, wherein the intermediate structure comprises at least two leg structures that are coupled to each other via their base end portions and coupled to the table structure via their table end portions and wherein the leg structures are coupled to each other via a connecting beam, which is distinct from the table structure.

The intermediate structure allows the table structure to be supported via two points. At the same time, the connecting beam for the leg structures ensures that loads in the table structure, in particular, in the region between the two connecting points with the intermediate structure, are reduced, as these forces may already be absorbed by the connecting beam.

In another embodiment, the connecting beam is arranged at a distance from the table end portions of the leg structures, which is smaller than the distance to the base end portions of the leg portions, whereby the stability of the intermediate structure may further be improved.

According to the disclosure, at least a portion of the table structure and/or a portion of the assembly base is formed as a truss structure. It is understandable that, for example, the leg portions of the intermediate structure, the longitudinal beam structure, particularly the longitudinal beam portions, the cross beam structure, particularly the main beam structure and/or the main beam support structure, may be formed as a truss structure.

BRIEF DESCRIPTION OF THE DRAWINGS

One embodiment of the disclosure is described in more detail in the following detailed description with reference to die accompanying drawings, wherein.

DETAILED DESCRIPTION

Figure 1:
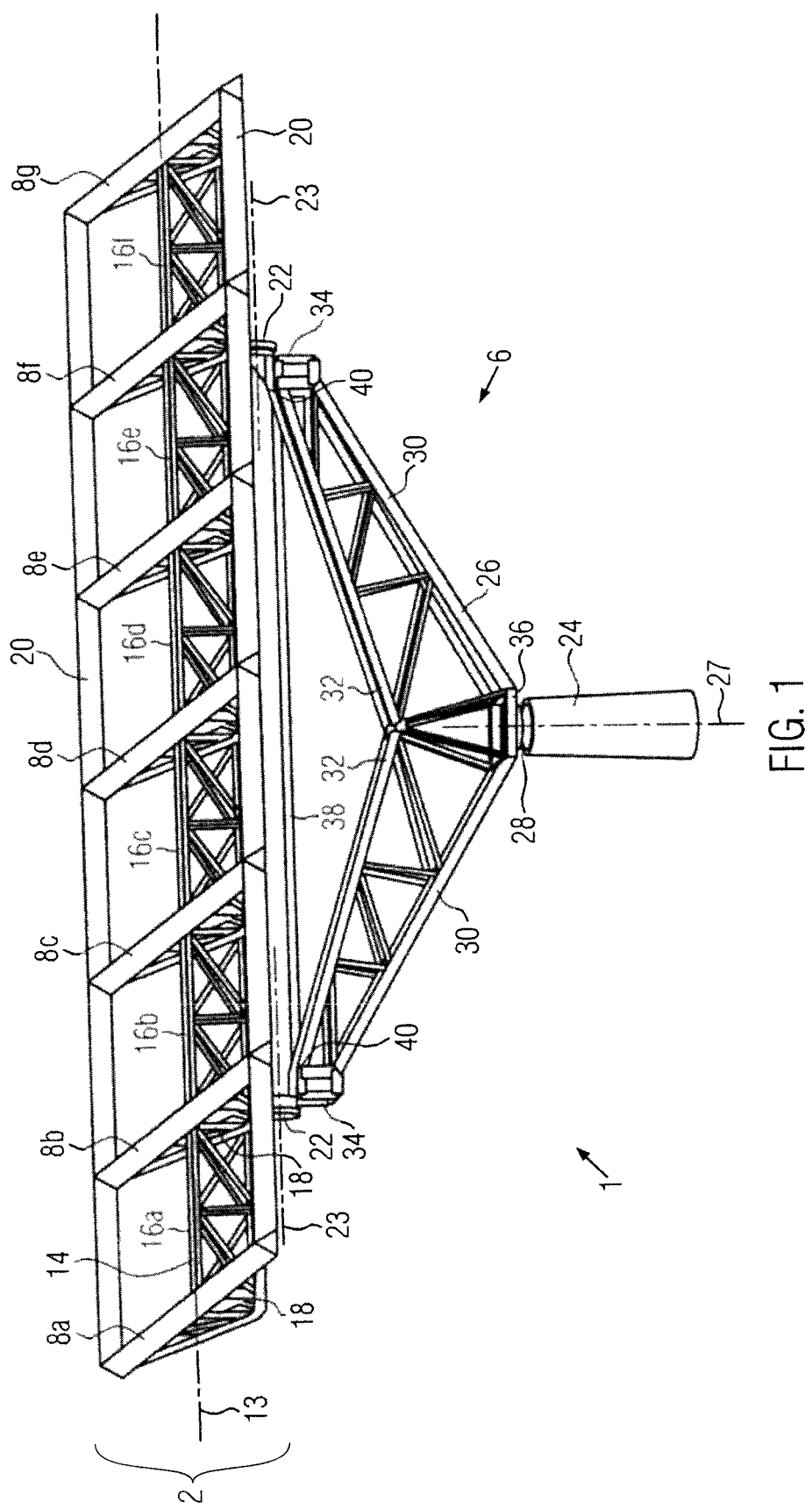
FIG. 1 shows a solar tracker assembly in an assembled state without solar panels mounted thereon.

FIG. 1 shows a perspective view of a solar tracker assembly 1 according to an embodiment of this disclosure. The solar tracker assembly 1 comprises a table structure 2 for supporting solar collectors 4 (FIG. 2), particularly for solar connector panels and/or solar connector assemblies, and an assembly base 6 for carrying the table structure 2.

Figure 11:
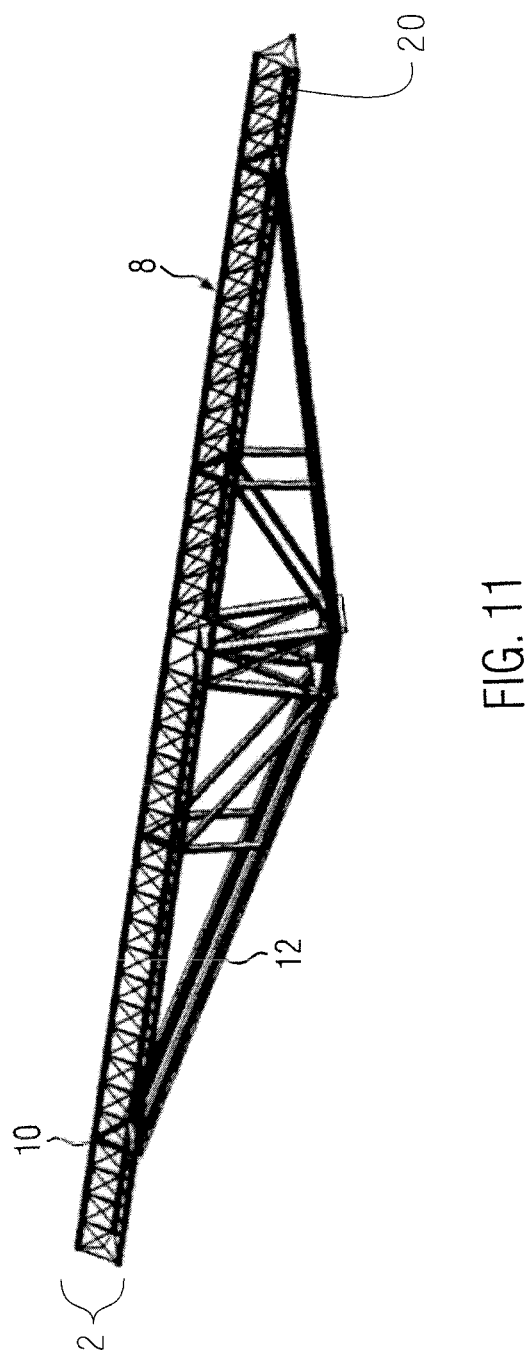
FIG. 11 shows a perspective view of a cross beam structure.

The table structure 2 comprises a plurality of cross beam structures 8a-8g that extend under a right angle to the longitudinal orientation of the table structure 2. According to FIG. 11, each cross beam structure 8a-8g comprises a main beam structure 10 and a main beam support structure 12, which is configured to support the main beam structure 10. Furthermore, the main beam structure 10 is configured to directly accommodate solar collectors 4.

As may be further understood from FIG. 1, the table structure 2 comprises a longitudinal beam structure 14, which extends along the longitudinal orientation of the table structure 2, in particular, along a central axis 13 of the table structure 2. Thereby, the longitudinal beam structure 14 is composed of a plurality of longitudinal beam portions

16a-16f, wherein each longitudinal beam portion 16a-16f is arranged to couple one of the cross beam structures 8a-8g to another one of the cross beam structures 8a-8g.

Furthermore, each longitudinal beam portion 16a-16f is coupled to the respective cross beam structures 8a-8g via its longitudinal end portions 18, wherein the longitudinal end portions 18 are coupled to the main beam support structure 12 of the respective cross beam structure 8a-8g. Particularly, as may be further understood from FIG. 1, a solar tracker assembly 1, according to the disclosure, may comprise six longitudinal beam portions 16a-16f that connect seven cross beam structures 8a-8g relative to each other. Further to this, the cross beam structures 8a-8g may, at their end portions, be coupled to each other by longitudinal coupling beams 20 in order to further increase the stability of the table structure 2.

The table structure 2 may be coupled to the base assembly 6 via two swivel joints 22, which may be formed as drive units, in particular, as servo motors. Each swivel joint 22 may be coupled to the main beam support structure 12 of a particular cross beam structure 8a-8g, and on the other side coupled to the assembly base 6. The particular cross beam structures 8a-8g that are coupled to the swivel joint 22 may be reinforced, e.g., by increasing the section of the straight members of the structure, to provide greater rigidity to the overall structure. Swivel joints 22 may define a common axis of rotation 23, which may extend along a horizontal or substantially horizontal orientation. Possibly, more than two swivel joints 22 can be incorporated into the structure.

Moreover, the assembly base 6 may comprise a base structure 24, which is adapted to be arranged in or on a solid ground, and an intermediate structure 26, which is arranged between the base structure 24 and the table structure 2 for supporting the table structure 2 relative to the base structure 24. The base structure 24 may, for example, be formed by a hollow tube, which is made from any suitable material such as steel or concrete. Likewise, the base structure 24 may be formed as a truss structure.

The intermediate structure 26 is mounted on the base structure 24 and rotatable about a vertical or substantially vertical axis of rotation 27 relative to the base structure 24. A swivel joint 28 between the base structure 24 and the intermediate structure 26 may be formed as a drive unit, in particular, as a servo motor.

Furthermore, the intermediate structure 26 may comprise a V-shape, comprising two leg structures 30. Leg structures 30 are coupled to each other via their base end portions 32 and coupled to the table structure 2 via their table end portions 34. Thus, the table end portions 34 are directly coupled to the swivel joints 22. The base end portions 32 are, in contrast, coupled to each other via a coupling structure 36, which is, in turn, connected to the swivel joint 28, which is arranged between the intermediate structure 26 and the base structure 24.

In addition, the leg structures 30 are coupled to each other via a connecting beam 38, which is distinct from the table structure 2. In one embodiment, the connecting beam 38 is coupled to the leg structures 30 at connecting points 40, which have a closer distance to the table end portions 34 than to the base end portions 32.

It may be understood from the drawings that the intermediate structure 26, the longitudinal beam portions 16a-16f, the cross beam structures 8a-8g, in particular, the main beam structures 10 and the main beam support structures 12 may be formed as truss structures. Even though not shown in FIG. 1, the base structure 24 may also be formed as a truss structure. The same applies to the longitudinal coupling beams 20.

Figure 2:
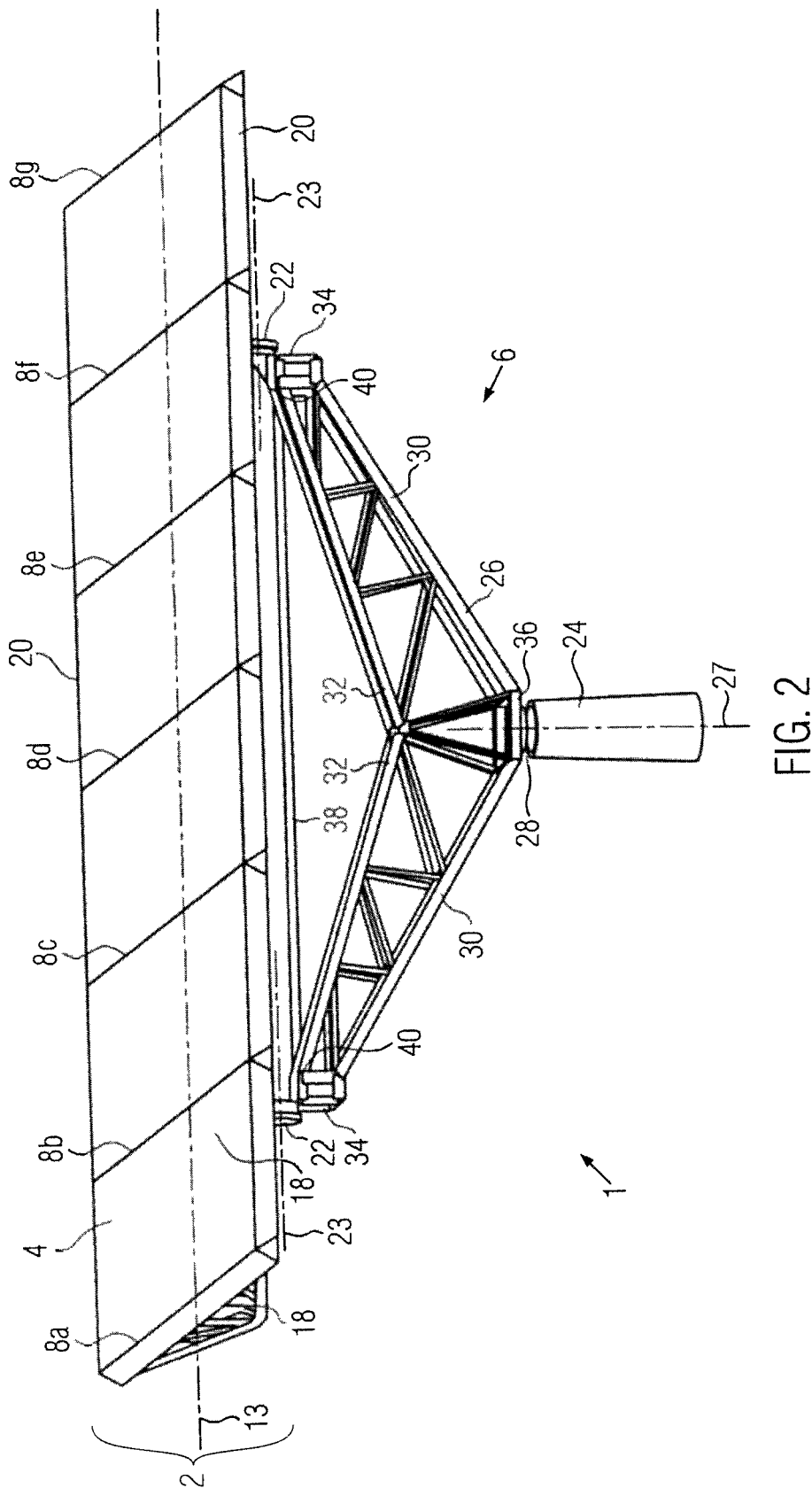
FIG. 2 shows a solar tracker assembly in an assembled state with solar panels mounted thereon.

In FIG. 2, the solar tracker of FIG. 1 is shown with solar collectors 4 mounted on the table structure 2. A solar tracker assembly 1, according to the disclosure, may accommodate solar collectors with a total area of more than 100 m$^2$, possibly more than 150 m$^2$, in particular, between 100 and 200 m$^2$, possibly between 150 and 200 m$^2$. One embodiment of the disclosure accommodates carrying a table structure 2 weighing, for example, 2.9 tonnes, which, in turn, accommodates solar modules with a total weight of 3.5 tonnes, but is not limited thereto.

Figure 3:
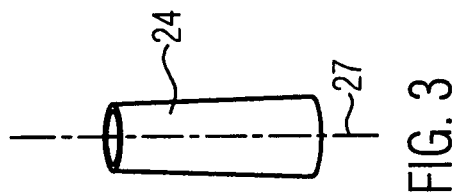
FIG. 3 shows a first assembly stage of the solar tracker assembly.

FIG. 3 shows a first assembly stage of the solar tracker assembly 1. Therein the base structure 24 is arranged in or on a solid ground and extends from the solid ground along a vertical or a substantially vertical orientation.

Figure 4:
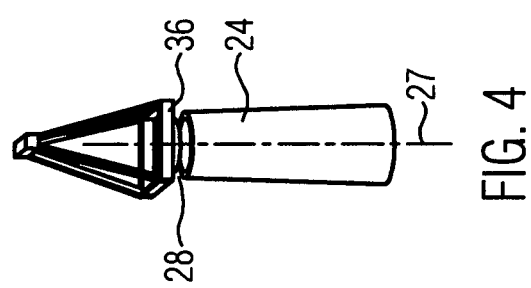
FIG. 4 shows a second assembly stage of the solar tracker assembly.

According to FIG. 4, in the second assembly stage, coupling structure 36 of the intermediate structure 26 is rotatably arranged on the base structure 24, wherein a swivel joint 28 is provided between the base structure 24 and the coupling structure 36.

Figure 5:
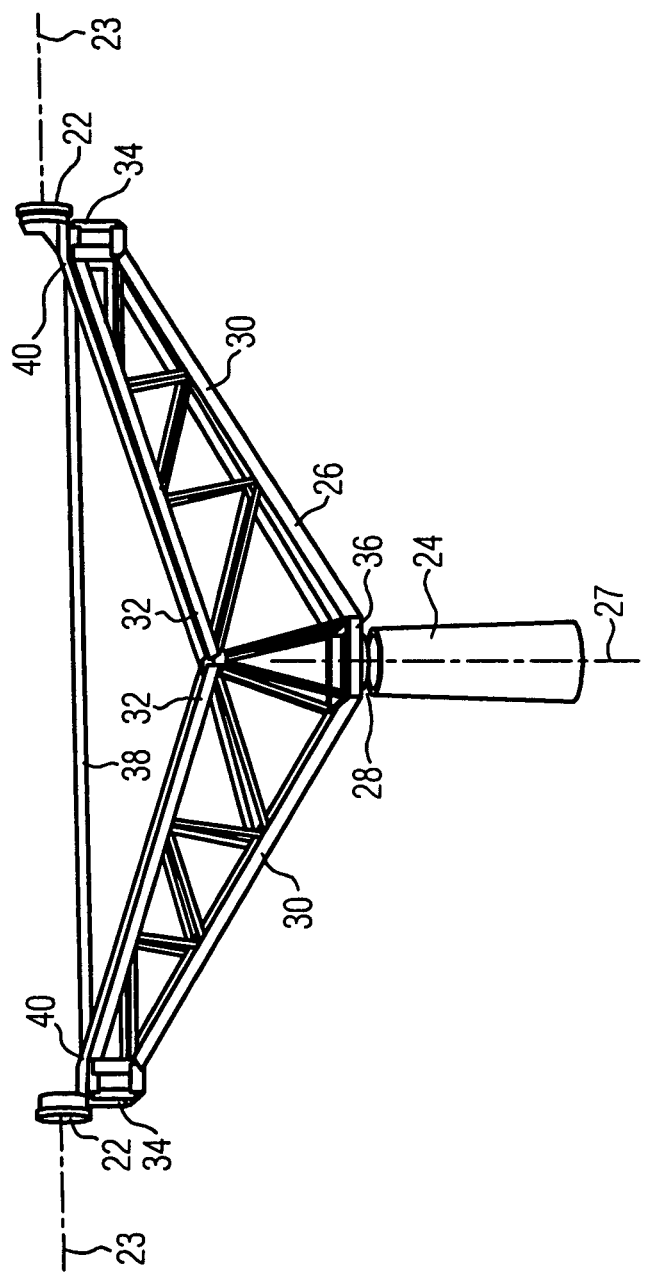
FIG. 5 shows a third assembly stage of the solar tracker assembly.

As shown in FIG. 5, the leg structures 30 are, via their base end portions 32, coupled to the coupling structure 36. Furthermore, connecting beam 38 is, via the connecting points 40, coupled to the leg structures 30 and, thereby, provides a connection of the leg structures 30 that is distinct from the coupling structure 36 and the table structure 2. Further, in the third assembly stage, the swivel joints 22, which are formed by drive units and, in particular, by servo motors, are connected to the table end portions 34 of the leg structures 30.

Figure 6:
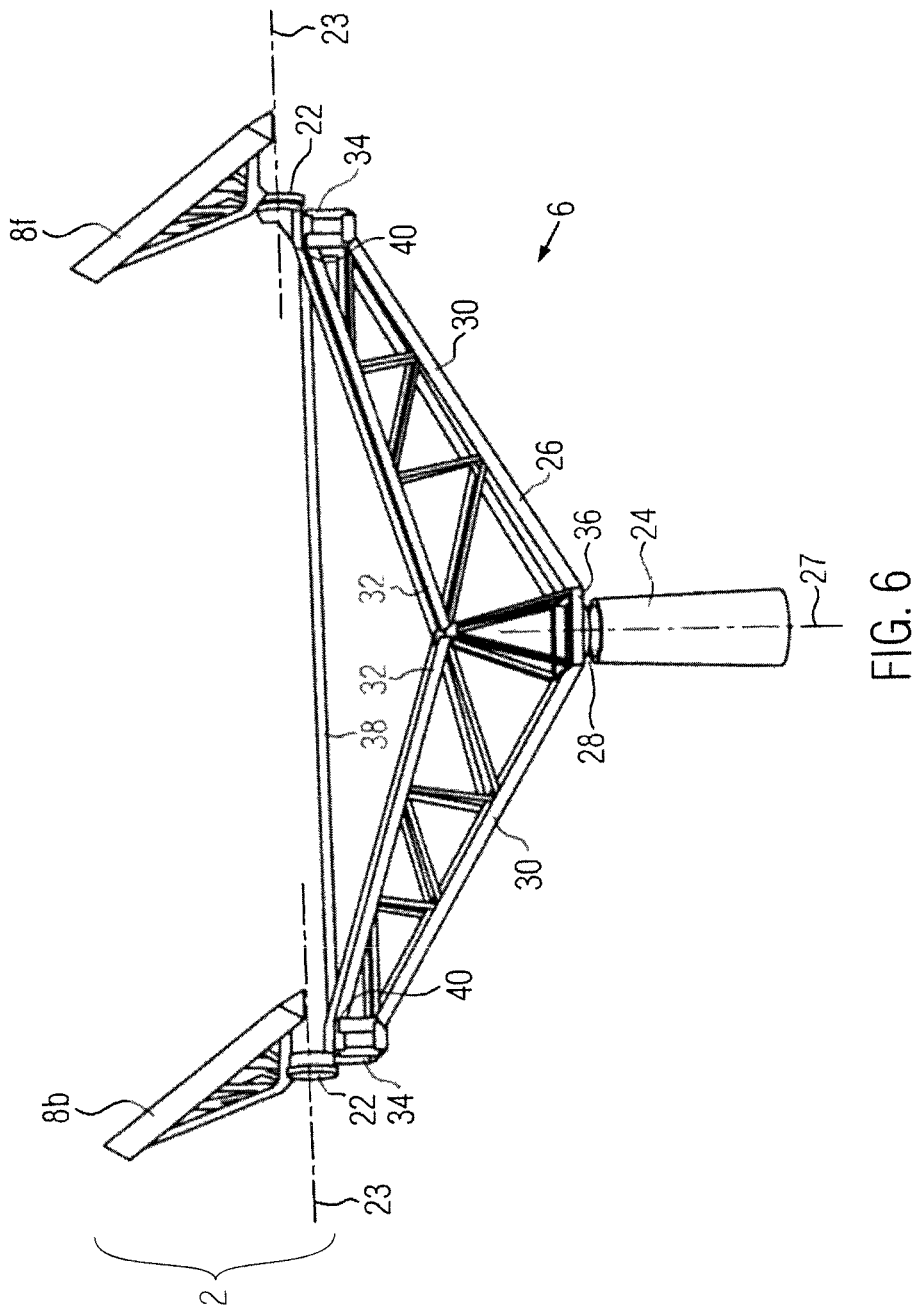
FIG. 6 shows a fourth assembly stage of the solar tracker assembly.

As may be understood from referring to FIG. 6, in the fourth assembly stage, cross beam structure 8b is connected to one of the swivel joints 22 and cross beam structure 8f is connected to the other swivel joint 22. Thus, the table structure 2 is coupled to the intermediate structure 26 via two swivel joints 22, each coupled to one cross beam structure.

Figure 7:
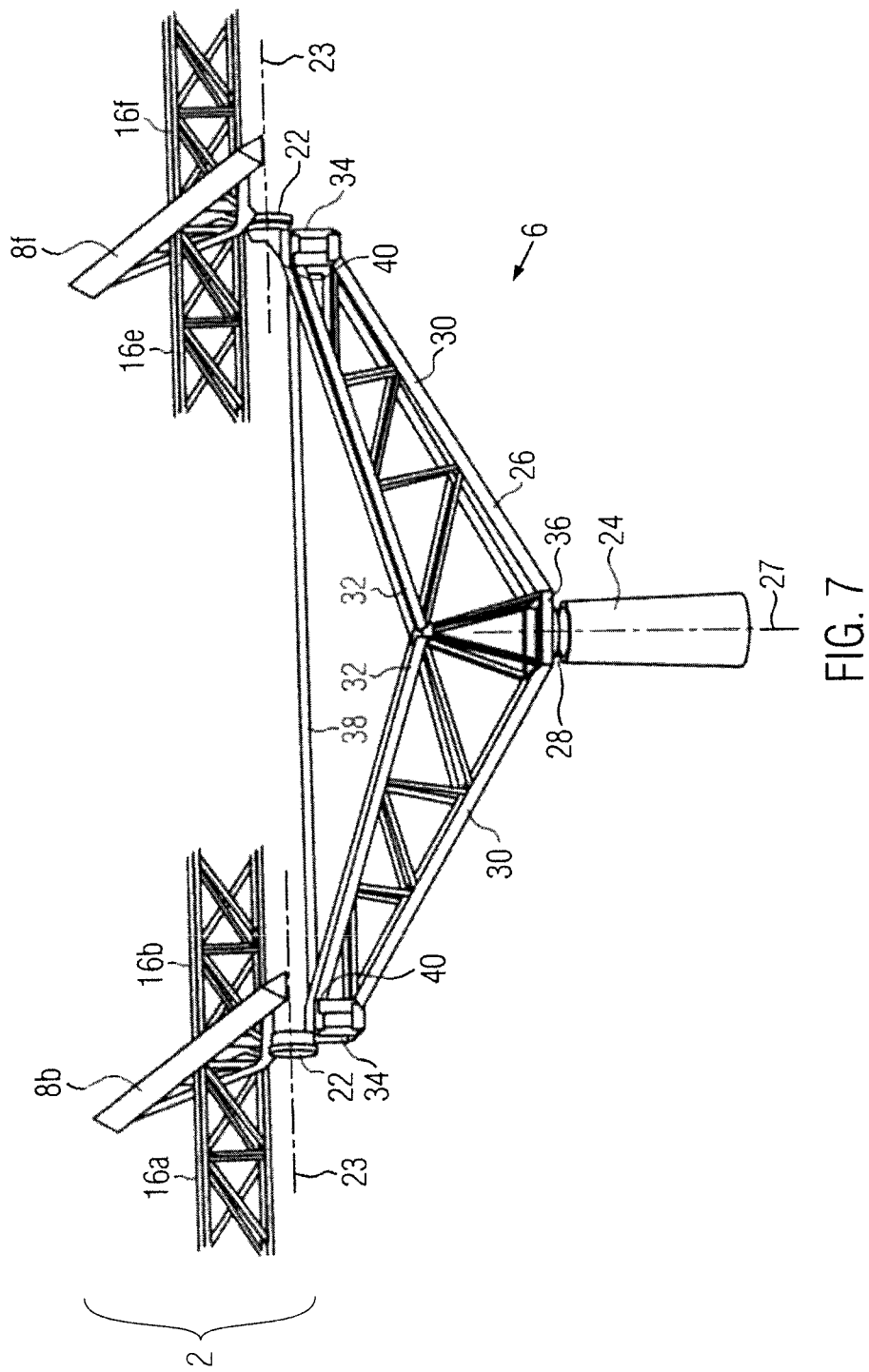
FIG. 7 shows a fifth assembly stage of the solar tracker assembly.

According to the fifth assembly stage as shown in FIG. 7, two longitudinal beam portions 16 are coupled to each cross beam structure 8. In particular, longitudinal beam portions 16a and 16b are coupled to cross beam structure 8b and longitudinal beam portions 16e and 16f are coupled to cross beam structure 8f. Thereby, one longitudinal beam portion 16a, 16b, 16e, 16f is connected to each side of the respective cross beam structure 8b, 8f, such that the longitudinal beam portions 16a, 16b, 16e, 16f extend from the respective cross beam structure 8b, 8f on its opposite sides and, thus, extend along a longitudinal orientation of the table structure 2.

Figure 8:
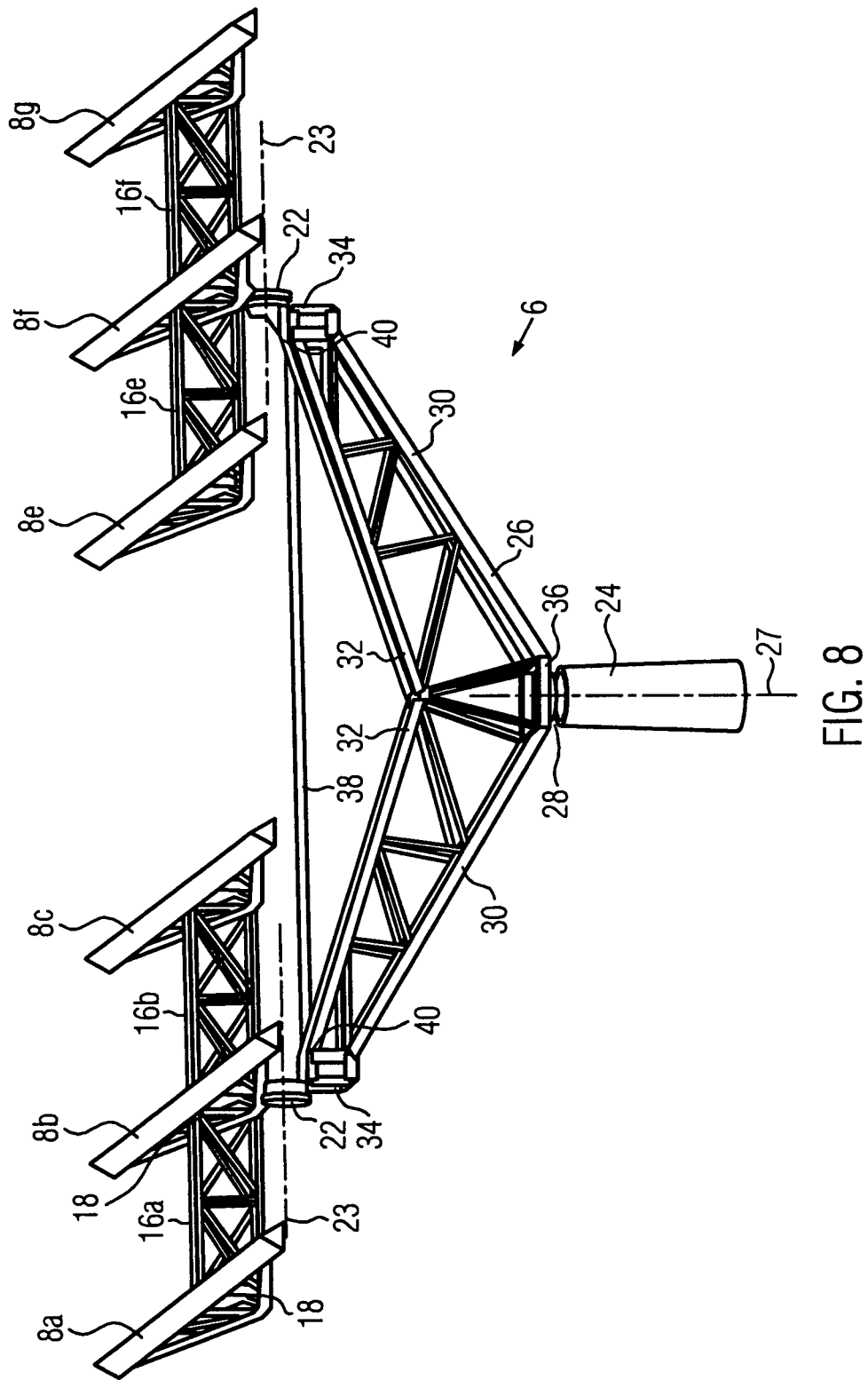
FIG. 8 shows a sixth assembly stage of the solar tracker assembly.

In the sixth assembly stage as shown in FIG. 8, four additional cross beam structures 8a, 8c, 8e, 8g are connected to the longitudinal beam portions 16a, 16b, 16e, 16f, which were mounted in the fifth assembly stage. The cross beam structures 8a, 8c, 8e, 8g mounted in this sixth assembly stage are, of course, connected to the longitudinal beam portions 16a, 16b, 16e, 16f at their longitudinal end portions 18, which are opposite to the longitudinal end portions 18, via which the longitudinal beam portions 16a, 16b, 16e, 16f were connected to the respective cross beam structures 8b, 8f in the fifth assembly stage shown in FIG. 7.

Figure 9:
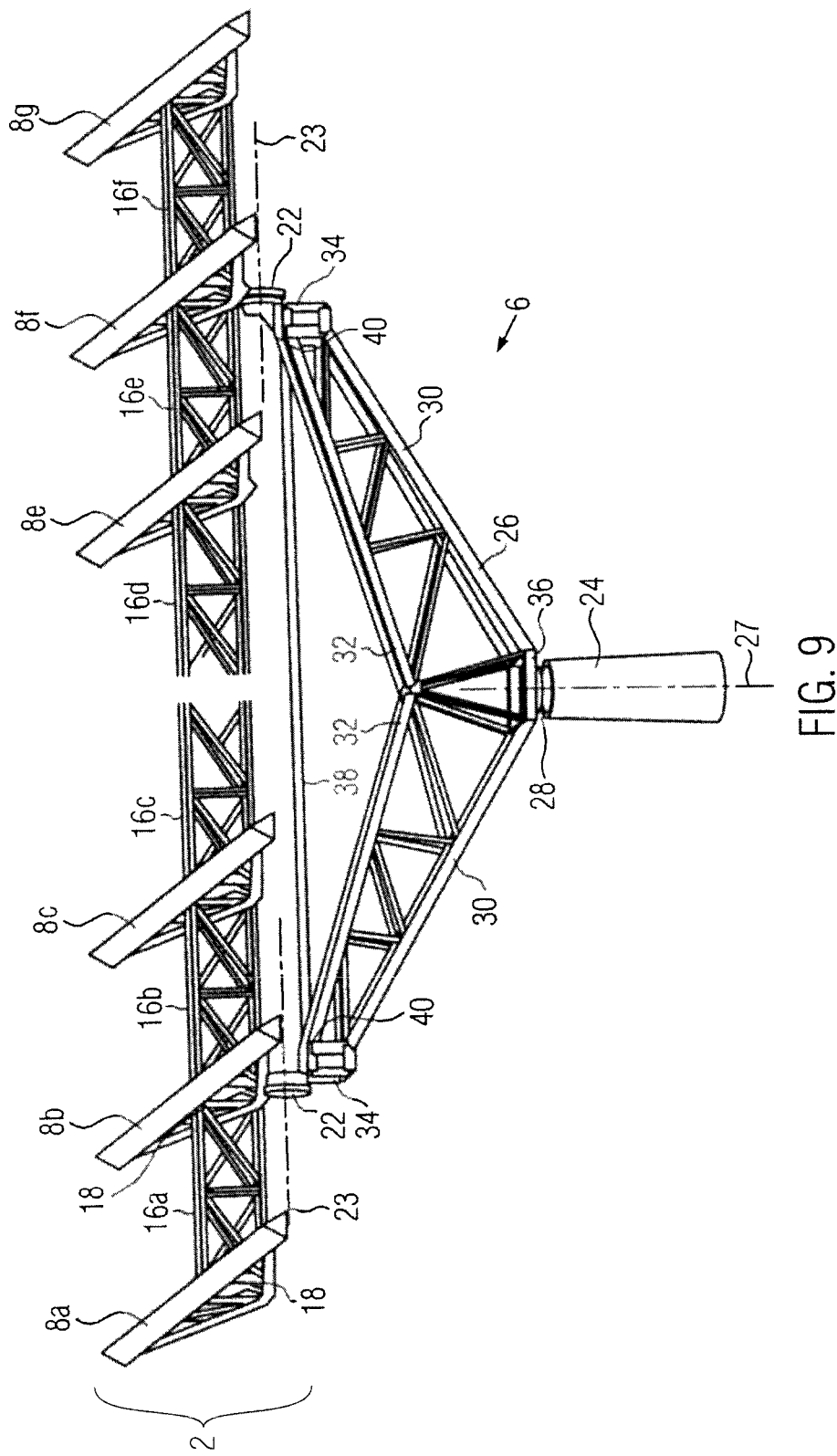
FIG. 9 shows a seventh assembly stage of the solar tracker assembly.

In the seventh assembly stage shown in FIG. 9, two more longitudinal beam portions 16c, 16d are mounted to cross beam structures 8c, 8e, which were mounted in the sixth assembly stage shown in FIG. 8, whereas the longitudinal beam portions 16c, 16d extend in the direction of the center point of the table structure 2. Accordingly, the longitudinal beam portions 16c, 16d assembled in this seventh assembly stage extend between the swivel joints 22.

Figure 10:
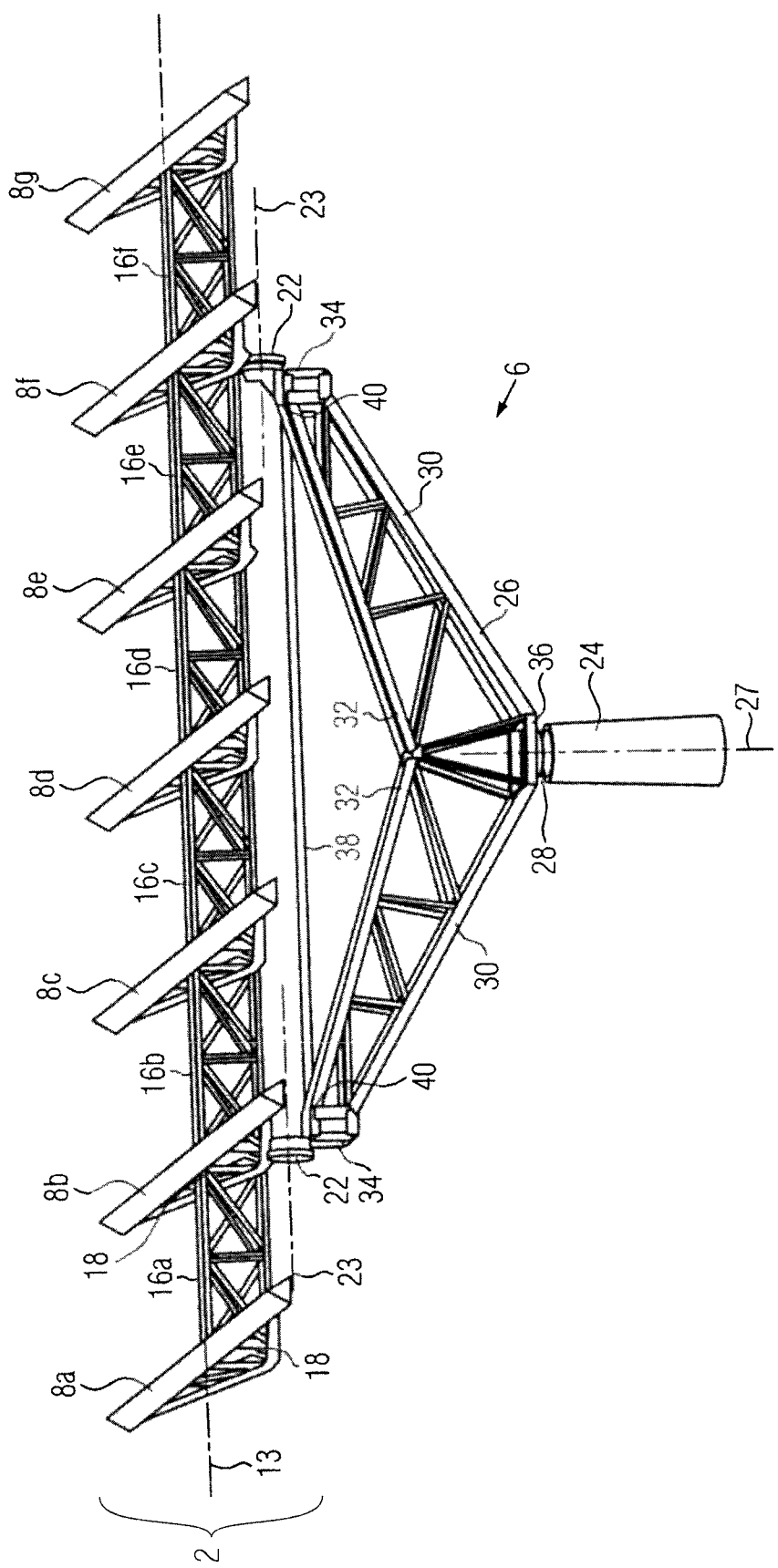
FIG. 10 shows an eighth stage of the solar tracker assembly.

According to FIG. 10, in the eighth assembly stage, an additional cross beam structure 8d is mounted between the longitudinal beam portions 16c, 16d, which were mounted in the seventh assembly stage shown in FIG. 9. Thus, in this eighth assembly stage, the last cross beam structure 8d is mounted, which accordingly connects the respective longitudinal beam portions 16c, 16d, which were mounted in the seventh assembly stage shown in FIG. 9, relative to each other.

In a ninth and final assembly stage of the solar tracker assembly 1, the longitudinal coupling beams 20 are mounted to the longitudinal end portions of the cross beam structures 8a-8g (collectively shown as 8), in order to connect them to each other. The final assembly stage may be better understood referring to FIG. 1. In addition to this final assembly stage for the solar tracker assembly 1, a further assembly stage may be conducted in which the solar panels 4 are mounted on the table structure 2 in order to obtain a complete solar tracker system, as shown in FIG. 2.

The invention claimed is:

1. A solar tracker assembly for solar collectors, comprising:
    a table structure for supporting solar collectors, and
    an assembly base for carrying the table structure,
    wherein the table structure is rotatably mounted to the assembly base via at least two swivel joints, and is rotatable relative to the assembly base at least about one axis of rotation,
    wherein at least a portion of the table structure and a portion of the assembly base are formed as a respective truss structure composed of a plurality of truss structure modules, which are coupled to each other to form the respective truss structure,
    wherein the assembly base comprises a base structure that is adapted to be arranged in or on a solid ground, and an intermediate structure that is arranged between the base structure and the table structure for supporting the table structure relative to the base structure, wherein the intermediate structure comprises at least two leg structures, which are coupled to each other via their base end portions and coupled to the table structure via their table end portions, wherein their table end portions are directly coupled to the swivel joints,
    wherein the table structure comprises at least one cross beam structure, the at least one cross beam structure comprises a main beam structure and a main beam support structure, and wherein the main beam support structure is coupled to and supports the main beam structure, the main beam structure being configured to directly accommodate solar collectors,
    wherein the table structure comprises at least one longitudinal beam structure, wherein the at least one longitudinal beam structure is formed as a truss structure and extends along a central axis of the table structure,
    wherein the at least one longitudinal beam structure couples a cross beam structure to at least another immediately adjacent cross beam structure, the at least one longitudinal beam structure is coupled to the cross beam structures via the entire cross section of longitudinal end portions of the longitudinal beam structure, and
    wherein a longitudinal coupling beam is in the same plane as the cross beam structure, and at least two cross beam structures are, at their end portions, coupled to each other by a longitudinal coupling beam.

2. The solar tracker assembly of claim 1, wherein two adjacent truss structure modules are connected to each other via joint members or welded to each other.

3. The solar tracker assembly of claim 1, wherein the table structure is coupled to the assembly base via the main beam support structure.

4. The solar tracker assembly of claim 1, wherein the longitudinal beam structure is coupled to the main beam support structures of the cross beam structures.

5. The solar tracker assembly of claim 1, wherein the table structure comprises at least one longitudinal beam structure that comprises a plurality of longitudinal beam portions.

6. The solar tracker assembly of claim 5, wherein each longitudinal beam portion couples at least a cross beam structure to at least another cross beam structure.

7. The solar tracker assembly of claim 6, wherein each longitudinal beam portion is coupled to the cross beam structures via longitudinal end portions of each respective longitudinal beam portion.

8. The solar tracker assembly of claim 6, wherein each longitudinal beam portion is coupled to the main beam support structures of the cross beam structures.

9. The solar tracker assembly of claim 1, wherein the table structure comprises at least one longitudinal beam structure that extends along a plane, which is arranged at a distance to a plane along which solar collectors extend in their installed state.

10. The solar tracker assembly of claim 1, wherein the swivel joints are arranged at a distance from each other in a longitudinal orientation of the table structure, wherein the distance corresponds at least to one-third of a longitudinal length of the table structure.

11. The solar tracker assembly of claim 1, wherein the leg structures are coupled to each other via a connecting beam, which is distinct from the table structure.

12. The solar tracker assembly of claim 1, wherein the table structure for supporting solar collectors comprises a table structure for supporting solar collector panels and/or solar collector assemblies.

13. The solar tracker assembly of claim 10, wherein the swivel joints are arranged at a distance from each other in a longitudinal orientation of the table structure, wherein the distance corresponds at least to two-thirds of a longitudinal length of the table structure.

14. The solar tracker assembly of claim 1, wherein the solar collectors are directly connected to the main beam structure.

* * * * *